(12) United States Patent
Fujita

(10) Patent No.: US 7,931,956 B2
(45) Date of Patent: Apr. 26, 2011

(54) ANISOTROPIC CONDUCTIVE FILM, METHOD FOR PRODUCING THE SAME, AND BONDED STRUCTURE

(75) Inventor: Yasuhiro Fujita, Kanuma (JP)

(73) Assignees: Sony Chemical & Information Device Corporation, Tokyo (JP); Sony Corporation, Tokyo (JP)

( * ) Notice: Subject to any disclaimer, the term of this patent is extended or adjusted under 35 U.S.C. 154(b) by 0 days.

(21) Appl. No.: 12/473,355

(22) Filed: May 28, 2009

(65) Prior Publication Data

US 2009/0239082 A1    Sep. 24, 2009

Related U.S. Application Data

(63) Continuation of application No. PCT/JP2008/060738, filed on Jun. 12, 2008.

(30) Foreign Application Priority Data

Jul. 3, 2007 (JP) ................. 2007-175428

(51) Int. Cl.
 *B32B 5/16* (2006.01)
 *B32B 27/30* (2006.01)
 *B32B 27/38* (2006.01)
 *B32B 37/06* (2006.01)

(52) U.S. Cl. ........ 428/220; 428/323; 428/332; 428/336; 428/413; 156/273.3

(58) Field of Classification Search ................. None
 See application file for complete search history.

(56) References Cited

U.S. PATENT DOCUMENTS

2006/0280912 A1* 12/2006 Liang et al. ............ 428/173
2008/0090943 A1*  4/2008 Xu et al. ................. 523/461

FOREIGN PATENT DOCUMENTS

| JP | 11-306861   | 11/1999 |
| JP | 2000-003621 |  1/2000 |
| JP | 2001-052778 |  2/2001 |
| JP | 2002-358825 | 12/2002 |
| JP | 2003-064324 |  3/2003 |

* cited by examiner

*Primary Examiner* — Monique R Jackson
(74) *Attorney, Agent, or Firm* — Oblon, Spivak, McClelland, Maier & Neustadt, L.L.P.

(57) ABSTRACT

Provided is an anisotropic conductive film, containing: an insulating layer formed of an insulating resin composition; and a conductive particle-contained layer containing a photo and thermal curing resin composition and conductive particles, the conductive particles being aligned into a monolayer in a portion adjacent to an interface with the insulating layer, in which the conductive particle-contained layer has a degree of cure which is gradually lowered in a thickness direction of the conductive particle-contained layer, from the side where the conductive particles are present to the side where the conductive particles are not present.

20 Claims, 8 Drawing Sheets

FIG. 1
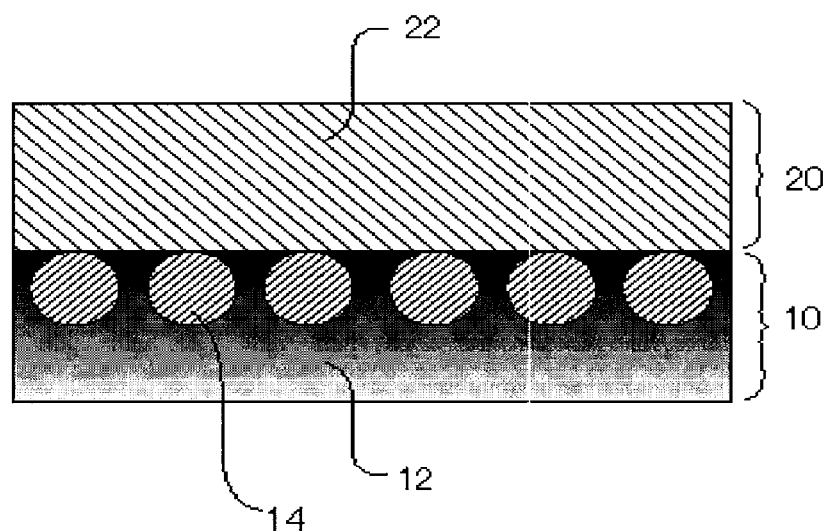
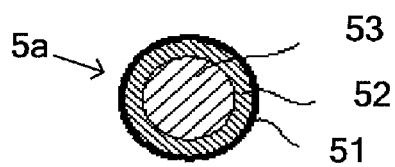
FIG. 2A
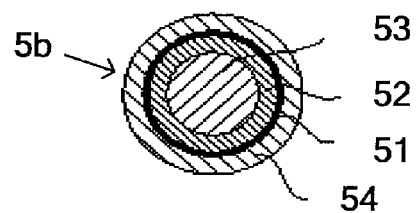
FIG. 2B
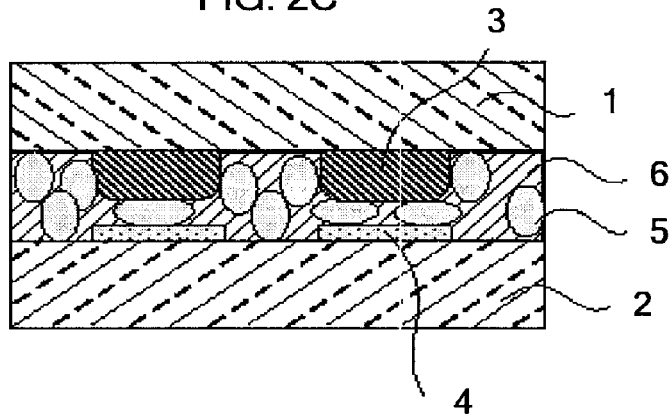
FIG. 2C

FIG. 3A
FIG. 3B
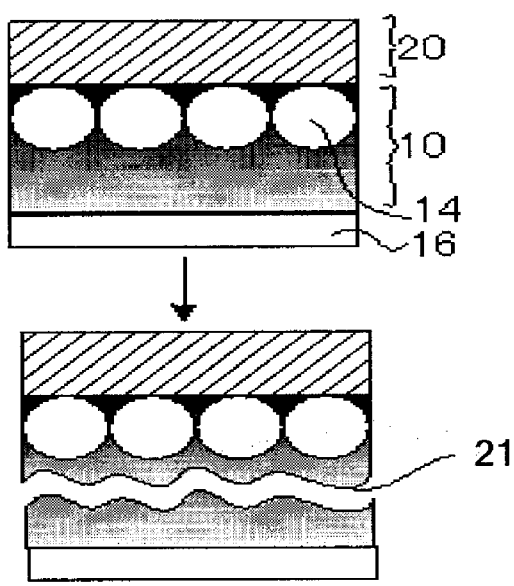
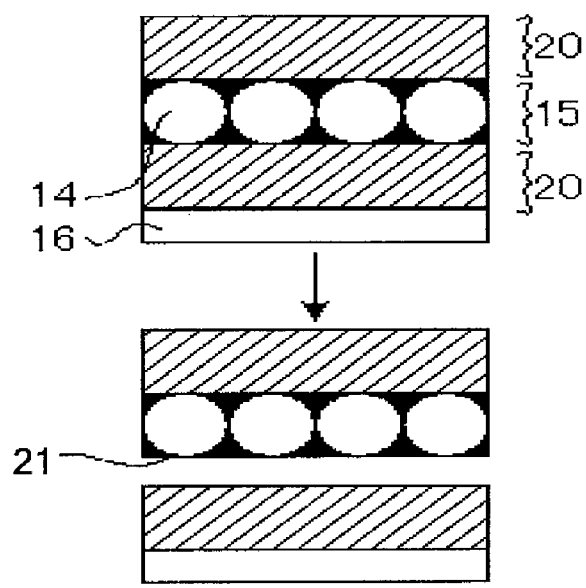

ANISOTROPIC CONDUCTIVE FILM, METHOD FOR PRODUCING THE SAME, AND BONDED STRUCTURE

CROSS-REFERENCE TO RELATED APPLICATION

This is a continuation of Application No. PCT/JP2008/060738, filed on Jun. 12, 2008.

BACKGROUND OF THE INVENTION

1. Field of the Invention

The present invention relates to an anisotropic conductive film that is capable of electrically and physically connecting between an electronic part of IC chip or a liquid crystal panel (LDC panel) of a liquid crystal display (LCD) and a substrate, or between substrates, and also relates to a method for efficiently producing the anisotropic conductive film, and a bonded structure for the electronic part and the substrate, etc. using the anisotropic conductive film.

2. Description of the Related Art

Anisotropic conductive adhesion films (ACF: Anisotropic Conductive Film) have conventionally been used as a means for connecting an electronic part and a circuit substrate. The anisotropic conductive adhesion film is used for adhering and electrically connecting between various terminals, for example a case for connecting a flexible print substrate (FPC) or a terminal of IC chip with ITO (Indium Tin Oxide) electrode formed on a glass substrate of LCD panel.

Commonly used anisotropic conductive adhesion film is a single-layered film in which conductive particles are dispersed in an epoxy resin insulating adhesive layer. For example, terminals of IC chip and ITO electrode of a glass substrate are electrically connected by disposing the conductive particles between the terminals of the IC chip and the ITO electrode.

The recent trends for miniaturized and high performance electronic devices lead to connection terminals of fine pitch, and as a result, the connection area of the terminal is reduced. Even though the connection area is reduced, reliability for high conduction is still required.

However, the single-layered anisotropic conductive adhesion film has a problem such that conductive particles are moved along with the insulation adhesive by the heat and pressure at the time of the connection. To ensure the electrical connection with such the anisotropic conductive adhesion film, it is necessary to maintain at least certain number of conductive particles on the terminal after the connection, and thus the number of the conductive particles contained in the insulating adhesive need to be increased.

In the art, there are also proposed a two-layered anisotropic conductive film. For example, the one having one layer (ACF) in which conductive particles are dispersed in an insulating adhesive and the other layer (NCF: non conductive film) formed of the same insulating adhesive but not dispersing any conductive particles therein, or the one having one layer in which conductive particles are dispersed in an insulating adhesive and the other layer formed of an insulating adhesive part of which is replaced with a different insulating adhesive to the insulating adhesive used in the layer containing the conductive particles. When such the anisotropic conductive adhesion film is used, terminals of IC chip are buried into the layer which does not contain the conductive particles, and the conductive particles dispersed in the other layer are sandwiched between the terminals of the IC chip and ITO electrode to thereby electrically connect the IC chip and ITO electrode. Therefore, the number of the conductive particles moved into the gaps between the terminals are reduced, and the ratio of the conductive particles stayed on the connection terminal (i.e. a particle capturing rate) is improved even though the amount of the conductive particles contained is smaller than that of the single-layered anisotropic conductive adhesion film.

However, pitch between terminals of electronic devices has been getting smaller and smaller as a trend, and if the two-layered anisotropic conductive adhesion film is used in such the electronic device, conductive particles are moved along with an insulating adhesive to the surrounding of IC chip by heat pressure at the time of the connection and the moved into the gap between terminals, causing a short circuit. Moreover, it is also insufficient in terms of the particle capturing rate. Therefore, it has been desired to develop a technology capable of preventing the movement of conductive particles at the time of connection.

Aiming at meeting with such demand, there has been proposed an anisotropic conductive adhesion film in which a photo-curable resin is used as an insulating binder, and conductive particles are dispersed and aligned into a monolayer in the photo-curable resin then exposed to UV light so as to fix the conductive particles in the binder (see Japanese Patent Application Laid-Open (JP-A) No. 2001-52778). As the conductive particles are fixed in the binder, this film prevents the conductive particle from moving at the time of the connection between terminals and an electrode, inhibits an occurrence of a short circuit and also maintains a high particle capturing rate. However, in the anisotropic conductive adhesion film disclosed in JP-A No. 2001-52778, the layer containing conductive particles (i.e. the conductive particle layer) is completely cured. In order to physical bond the IC chip with the glass substrate, it is necessary to have a three-layered structure in which the conductive particle layer is sandwiched with two adhesive insulating resin layers. The production of such the anisotropic conductive adhesion film has more processes than that of two-layered film, and thus the production efficiency is lowered. Moreover, it is difficult to accurately form the conductive particle layer at the thickness of 5 μm or less using a normal roll coater or comma coater.

There has been also proposed a two-layered anisotropic conductive adhesion film containing an insulating adhesive layer and an insulating binder layer in which conductive particles are embedded in the state of a monolayer (see JP-A No. 2003-64324). The insulating adhesive layer disclosed in JP-A No. 2003-64324 is cured by the radiation of actinic light, but is not cured and has adhesiveness before use. Since the layer containing the conductive particles has adhesiveness, this film enables to physically connect between IC chip and a glass substrate even though it has a two-layered structure. However, after these layers are preliminary bonded, this film needs to be subjected to the actinic light radiation so as to fix the conductive particles in the binder. In other words, users need to install a new apparatus for the exposure of the actinic light, and to control the conditions such as heat and light radiation. Accordingly, user's charge is increased at the time of use, and convenience is reduced.

As have been mentioned above, it is the current situation that there has not been provided a two-layered anisotropic conductive film which prevents the movement of conductive particles at the time of the connection between the electronic parts and the substrate or the like so as to prevent the occurrence of a short circuit, maintains high particle capturing rate so as to obtain excellent conductive reliability and is easily used.

BRIEF SUMMARY OF THE INVENTION

The present invention aims at solving the problems arisen in the conventional art, and achieving the following object. Namely, the object of the present invention is to provide a two-layered anisotropic conductive film which prevents the movement of conductive particles when used for bonding an electronic part and a substrate, etc., so as to prevent a short circuit, assures a high particle capturing ratio so as to attain excellent conduction reliability, and is easily handled. Another object of the present invention is to provide an efficient production method of the anisotropic conductive film, and a bonded structure of an electronic part and a substrate, etc., using the anisotropic conductive film, which has a high particle capturing ratio and excellent conduction reliability.

The means for solving the aforementioned problems are as follows:

<1> An anisotropic conductive film, containing: an insulating layer formed of an insulating resin composition; and a conductive particle-contained layer containing a photo and thermal curing resin composition and conductive particles, the conductive particles being aligned into a monolayer in a portion adjacent to an interface with the insulating layer, wherein the conductive particle-contained layer has a degree of cure which is gradually lowered in a thickness direction of the conductive particle-contained layer, from the side where the conductive particles are present to the side where the conductive particles are not present.

In the anisotropic conductive film of <1>, the conductive particle-contained layer has a degree of cure which is gradually lowered in a thickness direction of the conductive particle-contained layer, from the side where the conductive particles are present to the side where the conductive particles are not present. Namely, the degree of cure is high at the side where the conductive particles are present and is gradually lowered as closer to the side where the conductive particles are not present, and thus the degree of cure is deviated in the conductive particle-contained layer.

Therefore, the conductive particles are fixed in a portion adjacent to the interface with the insulating layer in the state where the conductive particles are aligned into a monolayer. When the anisotropic conductive film of the present invention is used for connecting an electronic part and a substrate, etc., the conductive particles are not moved when pressed and bonded, the conductive particles are captured by terminals at a high particle capturing ratio, and thus excellent conduction reliability is assured and it can be sufficiently applicable to terminals of narrower pitch. Moreover, as the side of the conductive particle-contained layer where the conductive p articles are not present is in the state of the low degree of cure and/or in the uncured state, the photo and thermal curing resin composition has adhesiveness, and can easily bonded to the substrate or the like, the anisotropic conductive film of the present invention is very conveniently used as it has the same functions as to the conventional three-layered anisotropic conductive film even though it is of two-layered structure.

<2> The anisotropic conductive film according to <1>, wherein the conductive particle-contained layer is formed by being exposed to curing light from the side where the conductive particles are present.

<3> The anisotropic conductive film according to <2>, wherein the exposure of the curing light is performed in at least one state of where a surface of the conductive particle-contained layer at which the conductive particles are not present is made into contact with oxygen, and where the conductive particle-contained layer is added with an absorbent for the curing light.

<4> The anisotropic conductive film according to any one of <1> to <3>, wherein the photo and thermal curing resin composition contains a photopolymerization initiator.

<5> The anisotropic conductive film according to any one of <1> to <4>, wherein the photo and thermal curing resin composition contains a thermoset initiator.

<6> The anisotropic conductive film according to any one of <1> to <5>, wherein the photo and thermal curing resin composition contains a (meth)acryl monomer, and the insulating resin composition contains epoxy resin.

<7> A method for producing an anisotropic conductive film, containing: aligning conductive particles into a monolayer at one side of a layer containing a photo and thermal curing resin composition, and exposing the one side of the layer to curing light so as to form a conductive particle-contained layer; and laminating an insulating layer formed of an insulating resin composition on the one side of the conductive particle-contained layer.

According to the method for producing in anisotropic conductive film of <7>, conductive particles are aligned into a monolayer at one side of a layer containing a photo and thermal curing resin composition, and the one side of the layer is exposed to curing light so as to form a conductive particle-contained layer, and an insulating layer formed of an insulating resin composition is laminated on the one side of the conductive particle-contained layer. As a result, an anisotropic conductive film is efficiently produced.

<8> The method for producing an anisotropic conductive film according to <7>, wherein the exposure of the curing light is performed in at least one state of where a surface of the layer at which the conductive particles are not present is made into contact with oxygen, and where the layer is added with an absorbent for the curing light.

<9> The method for producing an anisotropic conductive film according to any one of <7> or <8>, wherein the photo and thermal curing resin composition contains a photopolymerization initiator.

<10> The method for producing an anisotropic conductive film according to any one of <7> to <9>, wherein the photo and thermal curing resin composition contains a thermoset initiator.

<11> The method for producing an anisotropic conductive film according to any one of <7> to <10>, wherein the photo and thermal curing resin composition contains a (meth)acryl monomer and the insulating resin composition contains epoxy resin.

<12> A bonded structure contains at least two of electronic parts and substrate, and the anisotropic conductive film as defined in any one of <1> to <6>, wherein the at least two of electronic parts and substrates are electrically connected via the anisotropic conductive film.

In the bonded structure of <12>, at least two selected from the electronic parts and the substrates are electrically connected by using the anisotropic conductive film of the present invention, a particle capturing ratio of the conductive particle is high and thus conduction reliability is excellent.

<13> The bonded structure according to <12>, wherein the electronic part is selected at least one of an IC chip and a liquid crystal panel, and the substrate is selected from an ITO glass substrate, a flexible substrate, a rigid substrate and a flexible print substrate.

<14> The bonded structure according to any one of <12> or <13>, wherein a particle capturing ratio of the conductive particles is 80% or more at a connecting portion of the at least two of electronic parts and substrates.

According to the present invention, the problems in the art can be solved, and a two-layered conductive film which prevents the movement of conductive particles when used for bonding an electronic part and a substrate, etc., so as to prevent a short circuit, assures a high particle capturing ratio so as to attain excellent conduction reliability, and is easily handled can be provided. According to the present invention there are also provided an efficient production method of the anisotropic conductive film, and a bonded structure of an electronic part and a substrate, etc., using the anisotropic conductive film, which has a high particle capturing ratio and excellent conduction reliability.

BRIEF DESCRIPTION OF THE DRAWINGS

FIG. 1 is a schematic cross-sectional diagram showing an example of the anisotropic conductive film of the present invention.

FIGS. 2A to 2C are schematic explanatory diagrams showing examples of conductive particles.

FIGS. 3A and 3B are conceptual diagrams explaining a pealing test.

Figure 4A:
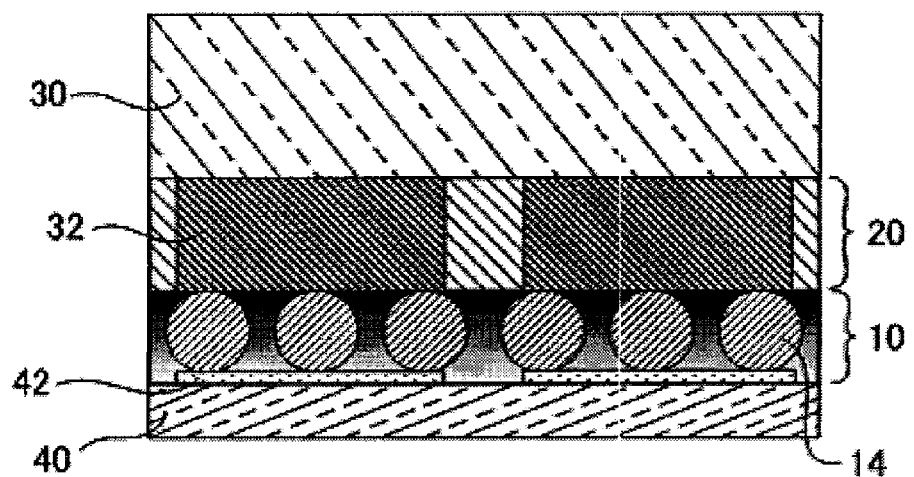
FIG. 4A is a schematic explanatory diagram (part 1) showing one example of the usage example of the anisotropic conductive film of the present invention.

DETAILED DESCRIPTION OF THE INVENTION (Anisotropic Conductive Film)

The anisotropic conductive film of the present invention contains at least an insulating layer, and conductive particle-contained layer, may contain a base film, and may further contain other layers.

Hereinafter, one example of the anisotropic conductive film of the present invention will be explained with reference to drawings. FIG. 1 is a schematic cross-sectional diagram showing one example of the anisotropic conductive film of the present invention.

As shown in FIG. 1, the anisotropic conductive film of the present invention contains the conductive particle-contained layer 10, and the insulating layer 20 disposed on the conductive particle-contained layer 10.

The insulating layer 20 is formed from the insulating resin composition 22. The conductive particle-contained layer 10 contains a photo and thermal curing resin composition 12 and conductive particles 14, and the conductive particles 14 are aligned in a monolayer adjacent to an interface with the insulating layer 20. Moreover, the degree of cure in the conductive particle-contained layer 10 is gradually lowered in the thickness direction from the side where the conductive particles 14 are present to the side where the conductive particles 14 are not present. Namely, the degree of cure in the conductive particle-contained layer 10 had a gradient, and in the region having a high degree of cure the conductive particles 14 are fixed in the state where they are aligned in a monolayer adjacent to the interface with the insulating layer 20. On the other hand, at the side in the conductive particle-contained layer 10, where the conductive particles 14 are not present, it has the low degree of cure thereof and/or in the uncured state, and the photo and thermal curing resin composition 12 has an adhesion thereto.

Note that, "uncured state" means a state where curing is not fully completed, and the resin flows as applied with pressure.
[Insulating Layer]

The insulating layer is formed of an insulating resin composition.
-Insulating Resin Composition- The insulating resin composition contains at least an insulating resin, and optionally contains arbitrarily selected other component.
--Insulating Resin--

The insulating resin is suitably selected depending on the intended purpose without any restriction. The insulating resin for use is preferably a thermosetting resin in view of heat resistance and reliability thereof. Suitably examples thereof include epoxy resin.

Examples of the epoxy resin include bisphenol A epoxy resin, bisphenol F epoxy resin, bisphenol S epoxy resin, phenol-novolak epoxy resin, cresol-novolak epoxy resin, bisphenol A-novolak epoxy resin, bisphenol F-novolak epoxy resin, alicyclic epoxy resin, glycidyl ester epoxy resin, glycidyl amine epoxy resin, hydantion epoxy resin, isocyanurate epoxy resin, aliphatic chain epoxy resin, and the like. These epoxy resins may be halogenated, or hydrogenated. Moreover, these expoxy resins may be used singly or in combination as the epoxy resin.
--Other Components--

The other components may be suitably selected depending on the intended purpose without any restriction, provided that these components adversely affect the effect of the present invention. Examples of the other components include a curing agent (latent curing agent) of the epoxy resin.

The latent curing agent means a substance that exhibit a function of a curing agent at a certain temperature, and examples thereof include those generally used as a curing agent for epoxy resin, such as amines, phenols, acid anhydrate, imidazol, dicyanediamine, and the like. Moreover, tertiary amines, organic phosphorous compound and the like, which are generally used as a curing accelerator, may also be used, as needed.

The thickness of the insulating layer is not particularly limited, and suitably adjusted depending on the thickness of the conductive particle-contained layer that will be described later. The thickness of the insulating layer is preferably 5 μm to 20 μm, more preferably 8 μm to 15 μm.

When the thickness is less than 5 μm, a filling ratio of the resin may be reduced between bumps. When the thickness is more than 20 μm, it may cause connection failures.

[Conductive Particle-Contained Layer]

The conductive particle-contained layer contains at least a photo and thermal curing resin composition and conductive particles, and optionally contains arbitrarily selected other components.

-Photo-Curing and Thermosetting Resin Composition-

The photo and thermal curing resin composition can be suitably selected depending on the intended purpose without any restriction, provided that the composition contains at least a photo and thermal curing resin (resin curable by the application of light and heat).

-Photo-curing and Thermosetting Resin-

The photo and thermal curing resin is suitably selected depending on the intended purpose without any restriction. For example, (meth)acrylic resin is suitably used.

The acrylic resin is suitably selected depending on the purpose without any restriction. Examples of thereof include methyl acrylate, ethyl acrylate, isopropyl acrylate, isobutyl acrylate, epoxy acrylate, ethylene glycol diacrylate, diethylene glycol diacrylate, trimethylol propane triacrylate, tetramethylene glycol tetraacrylate, 2-hydroxy-1,3-diacryloxypropane, 2,2-bis[4-(acryloxymethoxy)phenyl]propane, 2,2-bis [4-(acryloxyethoxy)phenyl]propane, dicyclopentenyl acrylate, tricyclodecanyl acrylate, tris(acryloxyethyl)isocyanurate, urethane acrylate, and the like. These may be used singly or in combination, as the acrylic resin.

Moreover, examples of the photo and thermal curing resin also include methacrylates of the acrylates listed above, and these may be used singly or in combination.

Furthermore, the photo and thermal curing resin composition preferably contain (meth)acryl monomers as a curing substance.

The (meth)acryl monomer is suitably selected depending on the intended purpose without any restriction. Examples thereof include urethane acrylate, epoxy acrylate, and the like.

The photo and thermal curing resin composition preferably contains a photopolymerization initiator, as curing of the resin caused by the exposure of light for curing is accelerated, and preferably further contains a thermoset initiator, as curing of the resin by the heat treatment is accelerated at the time when an electronic part or the like and a substrate or the like are connected using the anisotropic conductive film.

--Photopolymerization Initiator--

The photopolymerization initiator is suitably selected depending on the intended purpose without any restriction. Examples thereof include: benzoin ethers such as benzoin ethylether, isopropyl benzoin ether, etc.; benzyl ketals such as benzylhydroxycyclohexylphenylketone, etc.; ketones such as benzophenone, acetophenone, etc. and derivatives thereof, thioxanthones; bisimidazoles; and the like.

These may be used singly or in combination as the photopolymerization initiator. Moreover, these photopolymerization initiators may be added with a sensitizer such as amines, sulfur compounds, phosphorous compounds, etc., at the predetermined ratio, as necessary.

The amount of the photopolymerization initiator is suitably adjusted depending on the intended purpose without any restriction. The amount thereof is preferably 0.1 parts by mass to 5 parts by mass with respect to 100 parts by mass of the photo and thermal curing resin.

When the amount is less than 0.1 parts by mass, it may cause inferior curing.

When the amount is more than 5 parts by mass, it may lower the adhesion.

--Thermoset Initiator--

The thermoset initiator is suitably selected depending on the intended purpose without any restriction. Examples thereof include diacyl peroxides, peroxydicarbonates, peroxyesters, peroxyketals, dialkyl peroxides, hydroperoxides, silyl peroxides, and the like. These may be used singly, or in combination.

Examples of the diacylperoxides include isobutyl peroxide, 2,4-dichlorobenzoyl peroxide, 3,5,5-trimethylhexanoyl peroxide, octanoyl peroxide, lauroyl peroxide, stearoyl peroxide, succinic peroxide, benzoylperoxyltoluene, benzoyl peroxide, and the like.

Examples of the peroxydicarbonates include di-n-propylperoxydicarbonate, diisopropylperoxydicarbonate, bis(4-t-butylcyclohexyl)peroxydicarbonate, di-2-ethoxymethoxyperoxydicarbonate, di(2-ethylhexylperoxy)dicarbonate, dimethoxybutylperoxydicarbondate, di(3-methyl-3-methoxybutylperoxy)dicarbonate, and the like.

Examples of the peroxyesters include cumyl peroxyneodecanoate, 1,1,3,3-tetrabutyl peroxyneodecanoate, 1-cyclohexyl-1-methylethylperoxynoedecanoete, t-hexylperoxyneodecanoate, t-butylperoxypivalate, 1,1,3,3-tetrabutylperoxy-2-ethylhexanate, 2,5-dimethyl-2,5-di-(2-ethylhexanoylperoxy)hexane, 1-cyclohexyl-1-methylethylperoxy-2-ethylhexanate, t-hexylperoxy-2-ethylhexanate, t-butylperoxy-2-ethylhexanate, t-butylperoxyisobutylate, 1,1-bis(t-butylperoxy)cyclohexane, t-hexylperoxyisopropyl monocarbonate, t-butylperoxy-3,5,5-trimethylhexanate, t-butylperoxy laurate, 2,5-dimethyl-2,5-di(m-trioilperoxy)hexane, t-butylperoxyisopropyl monocarbonate, t-butylperoxy-2-ethylhexyl monocarbonate, t-hexylperoxybenzoete, t-butylperoxy acetate, and the like.

Examples of the peroxy ketals include 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-(t-butylperoxy)cyclododecane, 2,2-bis(t-butylperoxy)decane, and the like.

Examples of the dialkyl peroxides include α,α'-bis(t-butylperoxy)diisopropylbenzene, dicumyl peroxide, 2,5-dimethyl-2,5-di(t-butylperoxy)hexane, t-butylcumyl peroxide, and the like.

Examples of the hydroperoxides include diisopropylbenzene hydroperoxide, cumene hydroperoxide, and the like.

Examples of the silyl peroxides include t-butyltrimethylsilyl peroxide, bis(t-butyl)dimethylsilyl peroxide, t-butyltrivinylsilyl peroxide, bis(t-butyl)divinylsilyl peroxide, tris(t-butyl)vinylsilyl peroxide, t-butyltriallylsilyl peroxide, bis(t-butyl)diallylsilyl peroxide, tris(t-butyl)allylsilyl peroxide, and the like.

The amount of thermoset initiator is suitably adjusted depending on the intended purpose without any restriction. The amount is preferably 1 part by mass to 15 parts by mass with respect to 100 parts by mass of the photo and thermal curing resin.

When the amount is less than 1 part by mass, it may cause inferior curing.

When the amount is more than 15 parts by mass, it may lower the storage stability.

-Conductive Particle-

The conductive particles are suitably selected from those having the same structure as the one used in the conventional anisotropic conductive adhesive, without any restriction. Examples thereof include: metal particles of pewter, nickel or the like; resin, glass or ceramic particles coated with metal (nickel, gold, aluminum, cupper, or the like) plating; the aforementioned particles coated with an insulating material; and the like. By using these conductive particles, the irregularities in the smoothness of the terminals and wiring substrate to be connected are absorbed, and the process marine can be maintained at the time of the production. In addition, the conduction can be maintained even when the connecting point is detached by pressure, and thus high reliability can be attained.

Among these conductive particles, metal-coated resin particles, e.g. nickel-plated resin particles, are preferable, and insulating particles which are formed by coating with an insulating material are more preferable as these particles are capable of preventing a short circuit caused as a result that the conductive particles go into between terminals.

Specifically, for example in the case where IC chip 1 and a glass substrate 2 are connected as shown in FIG. 2C, the conductive particles 5 are sandwiched and squeezed between bumps 3 of the IC chip 1 and the ITO electrode 4 in the glass substrate 2 so that the bumps 3 and the ITO electrode 4 are electrically connected. In this case, even though there is unevenness in the height of bumps 3, the squeezed conductive particles 5 absorb the unevenness of the heights. One the other hand, the conductive particles 5 that do not contribute for electrical connection go into between the bumps 3, and may be clogged up there.

In the case where the conductive particles are NiAu coated resin particles 5a having the structure shown in FIG. 2A, a short circuit may be caused as the outermost layer 51 of the particle is formed of EL metal (Au). In the case of the insulating particles 5b having the structure shown in FIG. 2B, the squeezed particles between the bumps and the ITO electrode electrically connect the bumps and the ITO electrode as the outermost layer, i.e. the insulating layer, is peeled. Since insulating particles 5b that do not contribute for electrical connection are coated with an insulating resin 54, a short circuit does not occur when the insulating particles 5b are clogged up between the bumps 3. Accordingly, by using the insulating particles 5b shown in FIG. 2B, it is possible to formulate a large amount of the conductive particles 5, and also it is advantageous for a minute area connection by narrowing and downsizing the area of each bumps.

Note that, in FIGS. 2A to 2C, 6 denotes an anisotropic conductive film, 51 denotes Au layer, 52 denotes Ni layer, 53 denotes a resin, and 54 denotes an insulating resin.

The average particle size of the conductive particles is, for example, preferably 2 μm to 10 μm, more preferably 2 μm to 5 μm.

When the average particle size is less than 2 μm, the reliability of conduction may be lowered. When the average particle size is more than 10 μm, the reliability of insulation may be lowered.

The amount of conductive particles is suitably adjusted depending on the intended purpose without any restriction. The amount thereof is preferably 1 part by mass to 100 parts by mass with respect to 100 parts by mass of the photo and thermal curing resin.

When the amount thereof is less than 1 part by mass, the conduction may be insufficient. When the amount thereof is more than 100 parts by mass, a short circuit tends to be occurred.

The conductive particles need to be aligned in a monolayer at an interface with the insulating layer. This is advantageous as a large number of the conductive particles can be captured by each bump regardless of the area of a terminal (bump) where connected at the time, for example, when an electronic part and a substrate are connected.

-Other Component-

The other components are suitably selected from additives known in the art depending on the intended purpose without any restriction, provided that they adversely affect the effect obtainable by the present invention. Examples thereof include filler, a softener, an accelerator, an antioxidant, a colorant, a flame retardant, a silan coupling agent, and the like.

The amount of the other components is suitably selected depending on the amounts of the photo and thermal curing resin, the photopolymerization initiator, the thermoset initiator, and the conductive particle, without any restriction.

<Degree of Cure>

The conductive particle-contained layer has a degree of cure which is gradually lowered in the direction of the thickness of the conductive particle-contained layer, from the side where the conductive particles are present to the side where the conductive particles are not present. Specifically, the portion of the conductive particle-contained layer where the conductive particles are present has a high degree of cure, the degree of cure is gradually lowered as it is closer to the portion where the conductive particles are not present, and the degree of cure is deviant in the conductive particle-contained layer.

In this case, in the region where the degree of cure is high, the conductive particles are fixed in the conductive particle-contained layer in such manner that the conductive particles are aligned in a monolayer at an interface with the insulating layer. Thus, when, for example, an electronic part and a substrate are connected with the anisotropic conductive film of the present invention, the conductive particles are not moved at the time when the electronic part and the substrate are pressed and bonded to each other. As a result, the number of the conductive particles captured by the connecting part, e.g. a terminal (bump), can be increased (the particle capturing rate is improved), and thus it is advantageous. Moreover, as the portion of the conductive particle-contained layer where the conductive particles are not present has a low degree of cure or in the state of uncured, such portion has tackiness (adhesiveness). Accordingly, the adhesiveness of the conductive particle-contained layer to the substrate is maintained at the time when the electronic part and the substrate are connected, and any positioning error is prevented at the time when the anisotropic conductive film is pressed and adheres to the electronic part and the substrate.

The deviation in the degree of cure of the conductive particle-contained layer can be confirmed by conducting a peeling test of the anisotropic conductive film, and observing whether or not there is a clear interlayer surface on the peeled surface of the conductive particle-contained layer. In the case where there is no clear interlayer surface, the degree of cure has deviation. In the case where there is a clear interlayer surface, the degree of cure is not deviated (in the state completely cured, and the degree of cure is uniform in the thickness direction of the conductive particle-contained layer).

The peeling test is, for example, carried out in the following manner as shown in FIGS. 3A and 3B. At first, an adhesive tape 16 is adhered to a surface of the conductive particle-contained layer 10 at which the conductive particles 14 are not present, and the adhesive tape 16 is then peeled. When the degree of cure is deviated as shown in FIG. 3A, the resin which has a low degree of cure and/or is uncured in the conductive particle-contained layer 10 is peeled together with the adhesive tape 16. In this case, the peeled surface 21 has some irregularities and has no clear interlayer surface as the degree of cure is gradually lowered in the thickness direction of the conductive particle-contained layer 10. In the case where the degree of cure is not deviated as illustrated in FIG. 3B as an example of related art, when an adhesive tape 16 is adhered to a surface of one insulating layer 20 in contact with the conductive particle-contained layer 15 and then peeled, the portion attached with the adhesive tape 16 is peeled at an interlayer surface between the conductive particle-contained layer 15 and the insulating layer 20, as the conductive particle-contained layer 15 is completely cured. In this case, the insulating layer 20 is peeled together with the adhesive tape 16, its peeled surface 21 has a planar shape, and there is a clear interlayer surface.

The conductive particle-contained layer is preferably exposed to curing light from the side where the conductive particles are present. By exposing the conductive particle-contained layer to the curing light from the side where the conductive particles are present, the photo and thermal curing resin composition in the portion of the conductive particle-contained layer where the conductive particles are present can be cured. Moreover, the exposure of the curing light is preferably performed in the state where a surface of the conductive particle-contained layer at the side where the conductive particles are not present is in contact with oxygen gas, and/or in the state where an absorbent for the curing light is contained in the conductive particle-contained layer. In these cases, the degree of cure of the conductive particle-contained layer can be made deviate in the thickness direction of the conductive particle-contained layer. Since the oxygen is a reaction inhibitor for a radical reaction, the degree of cure at the side where the conductive particles are not present can be lowered when the exposure is carried out in the state where the surface at the side where the conductive particles are not present is in contact with the oxygen gas. Moreover, the absorbent for the curing light absorbs the curing light, and thus the transmission of the light for curing transmitted from the side where the conductive particles are present is shielded, resulting in that the degree of cure at the side where the conductive particles are not present being lowered.

At the time of the exposure of the curing light, it is preferable that a base material such as a transparent releasable PET sheet is adhered to the surface of the conductive particle-contained layer where the conductive particles are not present to shield oxygen present in the atmosphere. In this case, the surface of the conductive particle-contained layer where the conductive particles present is photocured as the surface does not have any contact with the oxygen which is the reaction inhibitor for a radical polymerization reaction.

In the case where the conductive particle-contained layer added with an absorbent for curing light is exposed to the curing light, the surface of the conductive particle-contained layer where the conductive particles are not present may be made into contact with oxygen as an open-system, or adhered to the transparent releasable PET sheet or the like so as to shield the oxygen.

The curing light is suitably selected depending on the characteristics of the photo and thermal curing resin composition for use. Examples thereof include an ultraviolet ray, laser beam, X-ray, electron beam, and the like.

In the case of an ultraviolet ray, examples of the light source for the ultraviolet ray include a mercury lamp, a metal hydride lamp, non-electrode lamp, and the like.

The exposure dose of the ultraviolet ray can be suitably selected depending on the characteristics of the light source, but the exposure dose of 0.2 J/cm$^2$ to 20 J/cm$^2$ is generally sufficient for curing.

The absorbent for the curing light is suitably selected depending on the intended purpose without any restriction, provided that it absorbs the curing light and inhibits the transmission of the curing light. For example, carbons are suitably used for the absorbent.

The thickness of the conductive particle-contained layer is suitable adjusted depending on the average particle size of the conductive particles and the thickness of the insulating layer, without any restriction. The thickness thereof is preferably 3 μm to 20 μm, more preferably 4 μm to 10 μm.

When the thickness thereof is less than 3 μm, the deviation in the degree of cure may not be attained. When the thickness thereof is more than 20 μm, it may cause a connection failure.

The anisotropic conductive film of the present invention has no restriction in terms of its shape provided that the anisotropic conductive film has a laminate structure containing the conductive particle-contained layer and the insulating layer, and the shape of the anisotropic conductive film can be suitably selected depending on the intended purpose. For example, the anisotropic conductive film is preferably in the shape of a long film having a width of 1 mm to 5 mm and a length of 10 m and to 300 m, which is wound around a reel. When the anisotropic conductive film has this shape, a conveyance and storage thereof become easy.

The total thickness of the anisotropic conductive film of the present invention is suitably adjusted depending on the thickness of the insulating layer and the thickness of the conductive particle-contained layer, without any restriction. For example, the total thickness of the laminate structural part containing the insulating layer and the conductive particle-contained layer is preferably 10 μm to 50 μm, more preferably 10 μm to 30 μm.

When the total thickness is less than 10 μm, the resin filling ratio between the bumps may be decreased. When the total thickness is more than 50 μm, it may cause connection failures.

-Usage-

Figure 4B:
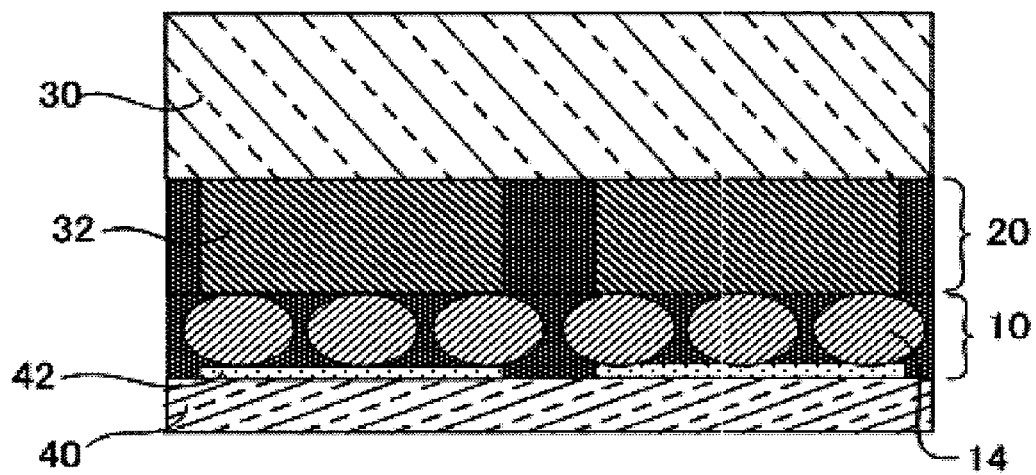
FIG. 4B is a schematic explanatory diagram (part 2) showing one example of the usage example of the anisotropic conductive film of the present invention.

As a usage of the anisotropic conductive film of the present invention, an application example thereof for a bonded structure for an IC chip for controlling a liquid crystal display and ITO glass substrate will be explained with reference to the drawings. As shown in FIG. 4A, an anisotropic conductive film shown in FIG. 1 is temporarily bonded so as to make conductive p article-contained layer 10 of the anisotropic conductive film in contact with ITO electrode 42 of ITO glass substrate 40, and to make an insulating layer 20 in contact with bumps 32 of the IC chip 30 for controlling a liquid crystal display. As shown in FIG. 4B, with the application of heat and pressure to compress and bond them, the resin of the insulating layer 20 was thermally cured in the state that it is moved off by the bumps 32 as the resin has a fluidity. Here, the degree of cure is high at the side of the conductive particle-contained layer 10 where the conductive particles 14 are present relative to the thickness direction of the conductive particle-contained layer 10, and the conductive particles 14 are fixed. Therefore, the conductive particles 14 are not moved by the pressure, and thus a high particle capturing ratio is maintained at the bumps 32. The degree of cure is gradually lowered towards the side of the conductive particle-contained layer 10 were the conductive particles 14 are not present, and thus the resin of the conductive particle-contained layer 10 at where the conductive particle 14 are not present is moved and removed by the compression of the bumps 32, and is thermally cured in the state where it is not prevent the connection between the ITO electrode 42 and the conductive particles 14. In this manner, the bonded structure between the IC chip 30 for the liquid crystal display and the ITO glass substrate 40 is formed, and the bumps 32 and the ITO electrode 42 are electrically connected via the conductive particles 14.

The anisotropic conductive film of the present invention has the conductive particle-contained layer in which the degree of cure is deviated. Therefore, relative to the thickness direction of the conductive particle-contained layer, the side where the conductive particles are present is fixed in The state where the conductive particles are aligned into a monolayer adjacent to the interface with the insulating layer, and the side where the conductive particles are not present is lower degree of cure and the resin present there has a tackiness. Because of this, the anisotropic conductive layer of the present invention exhibits the same function as to that of the conventional three-layered anisotropic conductive layer (NCF/ACF/NCF), even though the anisotropic conductive layer has a two-layered structure (NCF/ACF). Moreover, the anisotropic conductive film of the present can be handled easily, and when it is used for connecting an electronic part and a substrate or the like, the anisotropic conductive film can prevent the conductive particles from moving at the time of the connection to thereby prevent the occurrence of a short circuit, and maintain high particle capturing rate to thereby attain excellent conduction reliability.

The anisotropic conductive film of the present invention is suitably used for connecting various electric parts with a substrate, or a substrate with another substrate, and is suitably used for the production of IC tag, IC card, a memory card, a flat panel display, and the like.

A production method of the anisotropic conductive film of the present invention is not particularly limited, but the anisotropic conductive film of the present invention is suitably produced by the method for producing an anisotropic conductive film of the present invention.

(Method for Producing Anisotropic Conductive Film)

The method for producing an anisotropic conductive film of the present invention contains at least a step of forming a conductive particle-contained layer, and a step of laminating a insulating layer, and optionally contains arbitrarily selected other steps, as needed.

<Conductive Particle-Contained Layer Forming Step>

The conductive particle-contained layer forming step is aligning conductive particles into a monolayer at one side of the layer containing the photo and thermal curing resin composition, and exposing the layer to curing light from the one side so as to form a conductive particle-contained layer.

Note that, the details of the photo and thermal curing resin composition, the conductive particles, and the curing light are a, mentioned earlier.

The method for aligning the conductive particles into a monolayer in the portion of the layer containing the photo and thermal curing resin composition, which is adjacent to the one side of the layer is suitably selected depending on the intended purpose without any restriction. Examples thereof include: (1) a method in which the conductive particles are placed on the base material, and aligned into a monolayer by a plate member or the like so as to have a uniformed surface, and then the aligned conductive particles are pushed into a layer containing the photo and thermal curing resin composition; (2) a method in which the conductive particles are horizontally distributed on the base material by an air tube at a constant speed so as to be aligned into a monolayer, and the aligned conductive particles are pressed into the layer containing the photo and thermal curing resin composition; and (3) a method in which a photo and thermal curing resin solution containing the conductive particles are applied onto the base Material by a bar-coater or the like, and then the solvent is evaporated to remove from the system. Among them, the method (3) is preferable as this method has easy operations and the aligning of the conductive particles can be performed accurately.

Note that, the shape, structure, size, thickness, material or the like of the base material is suitably selected depending on the intended purpose without any restriction. The base material preferably has reliability. Preferable examples thereof include a transparent polyethylene terephthalate (PET) sheet, and the like.

The exposure of the curing light is preferably performed in the condition where the surface of the conductive particle-contained layer where the conductive particles are not present is made into contact with oxygen and/or where an absorbent for the curing light (also referred to as a curing light absorbent, hereinafter) is added to the conductive particle-contained layer. In such cases, the conductive particle-contained layer is formed so as to have a deviation in the degree of cure in the thickness direction thereof. Specifically, the oxygen is a reaction inhibitor for a radical polymerization reaction, and thus when the surface of the conductive particle-contained layer where the conductive particles are not present is in contact with oxygen, the oxygen lowers the degree of cure at the side of the conductive particle-contained layer where the conductive particles are not present. Moreover, as the curing light absorbent absorbs the curing light, the transmission of the curing light emitted from the side of the conductive particle-contained layer where the conductive particles are present is shielded to thereby lower the degree of cure at the side where the conductive particles are not present.

Note that, the details of the curing light and curing light absorbent are as described earlier.

At the time of exposure of the curing light, a side of the conductive particle-contained layer where the conductive particles are present is preferably bonded to the base material such as a transparent releasable PET sheet so as to shield oxygen contained in air. In this case, the surface of the conductive particle-contained layer where the conductive particles are present is not in contact with the oxygen which is a reaction inhibitor for the radical polymerization reaction, and thus is photocured.

In the case where exposure of the curing light is performed in the state where the conductive particle-contained layer is added with the curing light absorbent, the surface of the conductive particle-contained layer where the conductive particles are not present may be brought into contact with oxygen as an open system, or bonded to the transparent releasable PET sheet or the like so as to shield oxygen.

By mentioned above, the conductive particles are aligned into a monolayer at one side of the layer containing photo and thermal curing resin composition, and the layer is exposed to the curing light from the one side to thereby form the conductive particle-contained layer.

<Insulating Layer Laminating Step>

The insulating layer laminating step is laminating an insulating layer formed of an insulating rein composition on a surface of the conductive particle-contained layer (the side thereof at where the conductive particles are present).

The formation method of the insulating layer is suitably selected depending on the intended purpose without any restriction. Examples thereof include a method in which a solution containing the insulating resin composition is applied to the substrate.

Note that, the details of the insulating resin composition and various properties and characteristics of the insulating layer, such as the thickness and the like, are as mentioned earlier.

The method of laminating the insulating layer on the conductive particle-contained layer is suitably selected depending on the intended purpose without any restriction. Examples thereof include a method in which the insulating layer is laminated on the conductive particle-contained layer.

In the manner mentioned above, the insulating layer formed of the insulating resin composition is laminated on the surface of the conductive particle-contained layer.

In the manner mentioned above, two-layered anisotropic conductive film including the insulating layer and the conductive particle-contained layer is obtained.

According to the method for producing (in anisotropic conductive film of the present invention, the production line for two-layered anisotropic conductive films can be used, the number of process for layer formations can be reduced compared to the case of the conventional three-layered anisotropic conductive film, and thus it is efficient. In the case of the conventional three-layered anisotropic conductive film, it is necessary to form the ACF layer so as to hive a thickness of 5 μm or less, and it is difficult to accurately form a coating of uniform thickness. However, in the case of the present invention, the conductive particle-contained layer which combines the ACF layer and the NCF layer, and thus it is not necessary to maintain a thin coating and can be easy produced using a normal coater. Therefore, the method for producing an anisotropic conductive film of the present invention is particularly suitably used for the production of the anisotropic conductive film of the present invention.

(Bonded Structure)

In the bonded structure of the present invention, at least two of electronic parts and substrates are electrically connected via the anisotropic conductive film of the present invention. Specifically, the conductive particles are sandwiched and squeezed between terminals of the electronic part and the electrode or terminal of the substrate, or terminals of the substrates to thereby conduct between the terminals and the electrode.

The details of the anisotropic conductive film are as mentioned earlier.

The electronic parts are suitable selected depending on the intended purpose without any restriction. Examples thereof include IC chips such as IC chip for controlling a liquid crystal display in a flat panel display (FPD) or liquid crystal panel.

The substrate is suitably selected depending on the intended purpose without any restriction. Examples thereof include ITO glass substrate, flexible substrate, rigid substrate, flexible print substrate and the like.

The conductive particle capturing ratio at the bonded structure portion of the electronic part and the substrate (or bonded structure portion of the substrate and the substrate), i.e. the particle capturing ratio it terminals (bumps), is preferably as high as possible in view of the conduction reliability. For example, it is preferably 80% or more, more preferably 90% or more.

The particle capturing ratio means a ratio of the number of the conductive particles per unit area of the terminal before and after bonded to the electronic part and the substrate.

[Measurement of Particle Capturing Ratio]

The particle capturing ratio can be measured in the following manner.

(1) Numbers of the conductive particles present in the conductive particle-contained layer before bonded to the IC chip and ITO glass substrate are observed and counted under a microscope.

(2) Then, after boning the anisotropic conductive film to the IC chip and ITO glass substrate, a number of the conductive particles present on the bumps of the IC chip are counted using a microscope. Here, only conductive particles which clearly contributed to the conduction are counted and the conductive particles which are merely present at the edge of the bump, part of which is outside the bump, or which is not sufficiently squeezed by the bump and the ITO electrode are not counted.

(3) Based on the number obtained in (1) and (2), a ratio of the number of the conductive particles per unit area of the bump before and after bonded to the IC chip and ITO glass substrate is calculated. This ratio is equivalent to the particle capturing ratio.

Since the bonded structure of the present invention uses the anisotropic conductive film of the present invention, it has a high particle capturing rate of the conductive particles, and desirable conduction reliability and prevents the occurrence of a short circuit between the circuits.

Hereinafter, Examples of the present invention will be explained, but these examples shall not be construed to limit the scope of the present invention in any way.

EXAMPLE 1

-Production of Anisotropic Conductive Film-
<Conductive Particle-Contained Layer (ACF layer) Forming Step>

A coating solution of a conductive particle-contained layer was prepared using the ingredients shown in Table 1 below.

TABLE 1

| Ingredients | Proportion (part(s) by mass) |
| --- | --- |
| Acryl polymer(1604N, manufactured by Soken Chemical & Engineering Co., Ltd.) | 70 |
| Acryl monomer(3002A, manufactured by Kyoeisha Chemical Co., Ltd.) | 30 |
| Photopolymerization initiator(IRGANOX ® 369, manufactured by Chiba Japan K.K.) | 1 |
| Thermoset initiator(PERHEXA 3M, manufactured by NOF Corporation) | 4 |
| Toluene | 100 |
| Total | 205 |

Figure 5A:
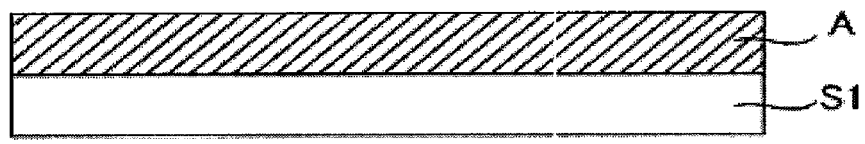
FIG. 5A is a process drawing (part 1) showing the method for producing the anisotropic conductive film in Example 1.

The thus obtained coating solution of a conductive particle-contained layer was applied onto a releasable PET sheet S1 using a bar coater, and dried at 60° C. for 10 minutes so as to evaporate the solvent contained therein, to thereby obtain a film A having a thickness of 10 μm (see FIG. 5A). The surface of the thus obtained film A had tackiness.

Figure 5B:
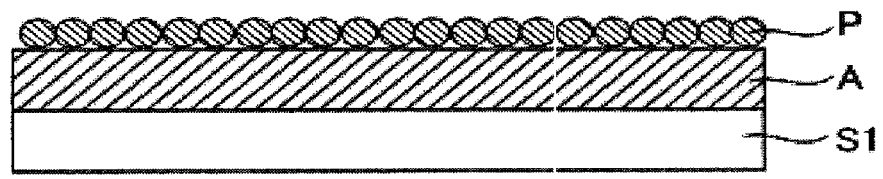
FIG. 5B is a process drawing (part 2) showing the method for producing the anisotropic conductive film in Example 1.

Subsequentially, 50 g of Ni—Au plating conductive particles P (BRIGHT GNR-EHLCD, manufactured by Nippon Chemical Industrial Co., Ltd.) having an average particle size of 4 μm was placed into a container having a volume of 0.1 L, circulated by means of an airjecter, and sprayed on the film A formed on a releasable PET sheet S1 at the ratio of 18,000 pieces/mm$^2$ from an air tube at the pressure of 0.5 MPa. Note that, the film A was conveyed at the speed of 0.6 m/min, and the air tube was fixed at the position 10 cm higher than the film A so that the conductive particles P were sprayed horizontally at a constant speed. As a result, the conductive particles P were aligned into a monolayer on the film A (see FIG. 5B).

Figure 5C:
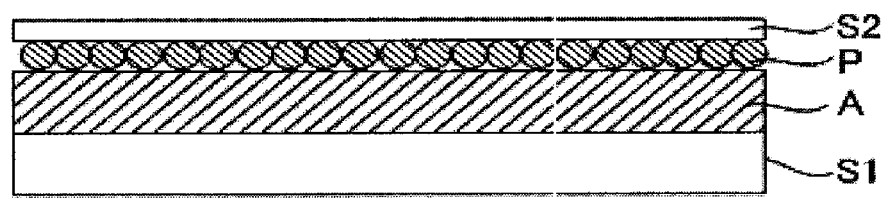
FIG. 5C is a process drawing (part 3) showing the method for producing the anisotropic conductive film in Example 1.

The surface of the monolayered conductive particles P on the film A was laminated with a releasable PET sheet S2 which had a less thickness than that of the releasable PET sheet S1 (see FIG. 5C).

Figure 5D:
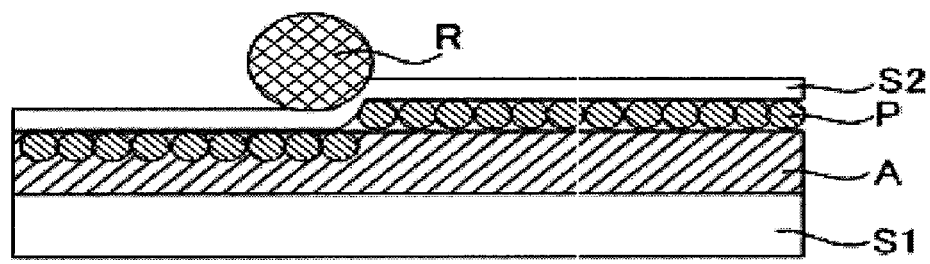
FIG. 5D is a process drawing (part 4) showing the method for producing the anisotropic conductive film in Example 1.
Figure 5E:
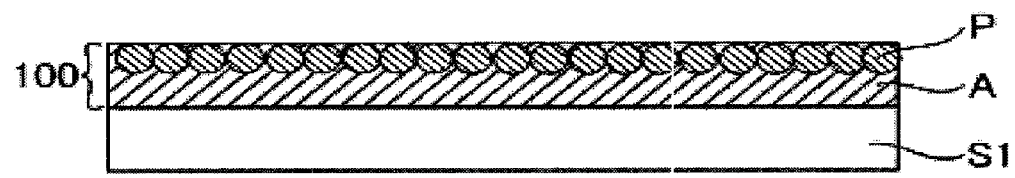
FIG. 5E is a process drawing (part 5) showing the method for producing the anisotropic conductive film in Example 1.

Then, the conductive particles P were pressed into the film A from the side of the releasable PET sheet S2 by a roll laminator R, and were embedded in the film A (see FIG. 5D). Thereafter, the releasable PET sheet S2 was released, and the conductive particle-contained layer 100 in which the conductive particles P were aligned into a monolayer at one surface side of the film A relative to the thickness direction of the film A was obtained as shown in FIG. 5E.

The amount of the conductive particles P aligned into a monolayer was 18,000 pieces/mm$^2$ on the number average, and the amount of the conductive particles P contained in the conductive particle-contained layer 100 was 3 vol % per 10 μm-thickness on the volume average.

Figure 5F:
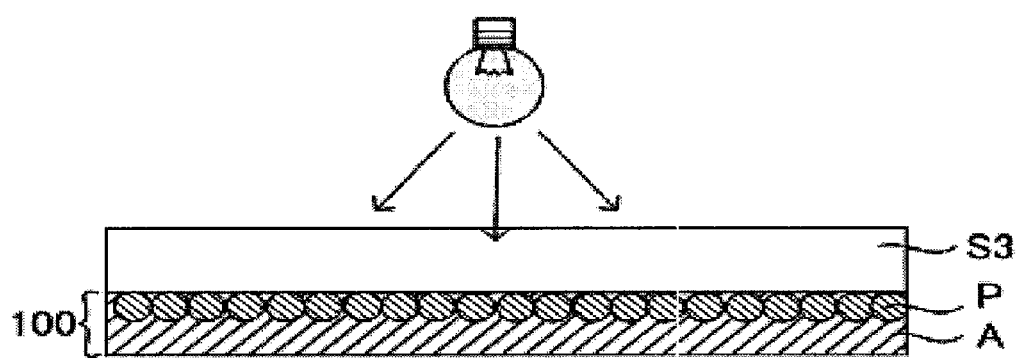
FIG. 5F is a process drawing (part 6) showing the method for producing the anisotropic conductive film in Example 1.

A transparent releasable PET sheet S3 was laminated on the side of film A at which the conductive particles P were present, and the transparent releasable PET sheet S1 bonded to the other side was released. As the curing light, a UV light was used and the film A was exposed to the UV light from the side of the transparent PET sheet S3 at the exposure dose of 13 mW/cm$^2$ for 1 minute by means of a high pressure mercury vapor lamp (see FIG. 5F). As a result of this, the side of the conductive particle-contained layer 100 at which the conductive particles P were present was photocured, and relative to the thickness direction thereof, the portion of the conductive particle-contained layer which was lower side from the conductive particles P (the side where the conductive particles P were not present) was not photocured as oxygen contained in air worked as a reaction inhibitor for a radical polymerization reaction. The both sides of the conductive particle-contained layer 100 had had tackiness before the exposure of the UV light, but after the exposure of the UV light it was found that only the side of the conductive particle-contained layer 100 at which the conductive particles P were present lost tackiness.

<Laminating Step of Insulating Layer (NCF Layer)>

A coating solution for an insulating layer was prepared based upon the ingredients shown in Table 2.

TABLE 2

| Ingredients | Proportion (parts by mass) |
|---|---|
| Epoxy resin (EP828, manufactured by Japan Epoxy Resins Co., Ltd.) | 40 |
| Phenoxy resin (PKHH, manufactured by Union Carbide Corporation) | 30 |
| Latent curing agent (HX3941HP, manufactured by Asahi Kasei Corporation) | 30 |
| Toluene | 100 |
| Total | 200 |

Figure 5G:
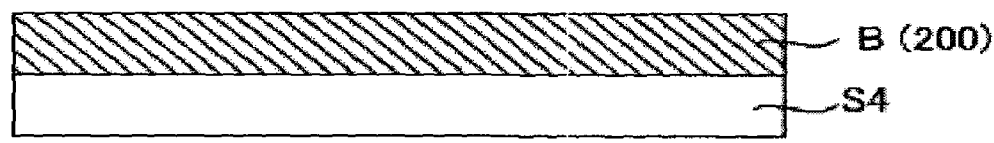
FIG. 5G is a process drawing (part 7) showing the method for producing the anisotropic conductive film in Example 1.

The thus obtained coating solution for the insulating layer was applied onto a transparent releasable PET sheet S4 by a bar-coater, and dried at 60° C. for 10 minutes so as to evaporate the solvent, to thereby obtain a Film B (an insulating layer 200) having a thickness of 10 μm (see FIG. 5G).

Figure 5H:
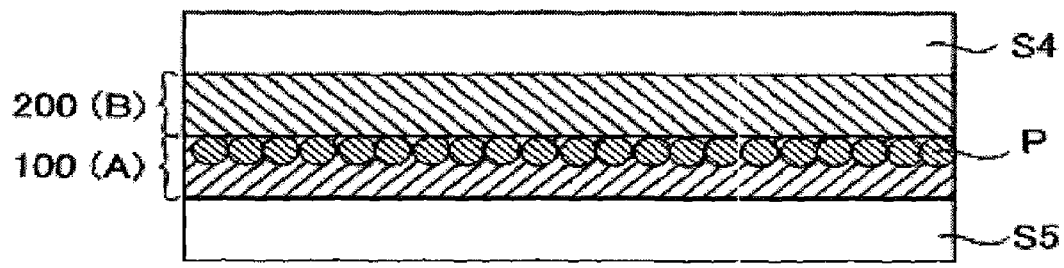
FIG. 5H is a schematic explanatory diagram showing the anisotropic conductive film of Example 1.

Subsequentially, the transparent releasable PET sheet S3 which had been laminated on the conductive particle-contained layer 100 was released, an insulating layer 200 was laminated on the surface from which the transparent releasable PET sheet S3 was released. On the surface of the conductive particle-contained layer 100 at which the conductive particles P are not present, a releasable PET sheet S5 was laminated, to thereby obtain an anisotropic conductive film (see FIG. 5H).

EXAMPLE 2

-Production of Anisotropic Conductive Film-

An anisotropic conductive film was produced in the same manner as in Example 1, provided that the conductive particle-contained layer forming step was performed in the following manner.

<Conductive Particle-Contained Layer (ACF Layer) Forming Step>

A coating solution of a conductive particle-contained layer was prepared based upon the ingredients shown in Table 3.

TABLE 3

| Ingredients | Proportion (part(s) by mass) |
|---|---|
| Bifunctional acryl monomer (CN112C60, manufactured by Sartomer Company, Inc.) | 70 |
| Phenoxy resin (PKHH, manufactured by Union Carbide Corporation) | 30 |
| Photopolymerization initiator (IRGACURE ® 369, manufactured by Chiba Japan K.K.) | 1 |
| Thermoset initiator(organic peroxide) (PERHEXA 3M, manufactured by NOF Corporation) | 4 |
| Conductive particle(BRIGHT GNR-EHLCD, diameter of 4 μm, manufactured by Nippon Chemical Industrial Co., Ltd.) | 80 |
| Toluene | 100 |
| Total | 285 |

Figure 6A:
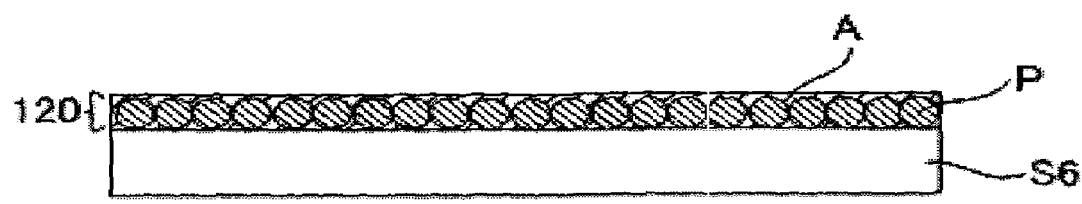
FIG. 6A is a schematic explanatory diagram (part 1) showing the conductive particle-contained layer forming step in the method for producing the anisotropic conductive film of Example 2.
Figure 6B:
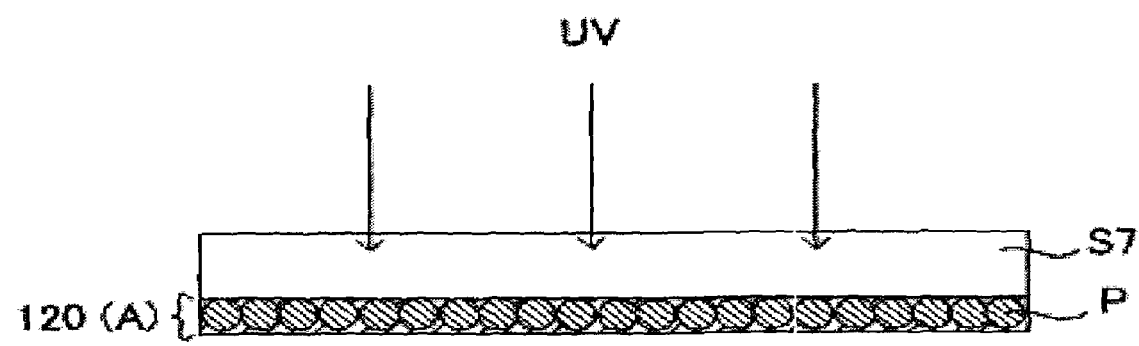
FIG. 6B is a schematic explanatory diagram (part 2) showing the conductive particle-contained layer forming step in the method for producing the anisotropic conductive film of Example 2.

The thus obtained coating solution of a conductive particle-contained layer was applied onto a releasable PET sheet S6 using a bar coater, and dried in an oven at 60° C. for 10 minutes so as to evaporate the solvent contained therein, to thereby obtain a film A (a conductive particle-contained layer 120) having a thickness of 5 μm (see FIG. 6A). The surface of the thus obtained film A had tackiness.

A transparent releasable PET sheet S7 was laminated on the side of film A at which the conductive particles P were present, and the transparent releasable PET sheet S6 bonded to the other side was released. As the curing light, a UV light was used and the film A was exposed to the UV light from the side of the transparent PET sheet S7 at the exposure dose of 13 mW/cm$^2$ for 1 minute by means of a UV irradiator (Cure Max, manufactured by Ohmiya Kasei Corporation) (see FIG. 6B). As a result of this, once the transparent releasable PET sheet S7 was released, the both sides of the conductive particle-contained layer 120 had had tackiness before the exposure of the UV light, but after the exposure of the UV light, it was found that only the side of the conductive particle-contained layer 120 at which the conductive particles P were present lost tackiness.

Figure 6C:
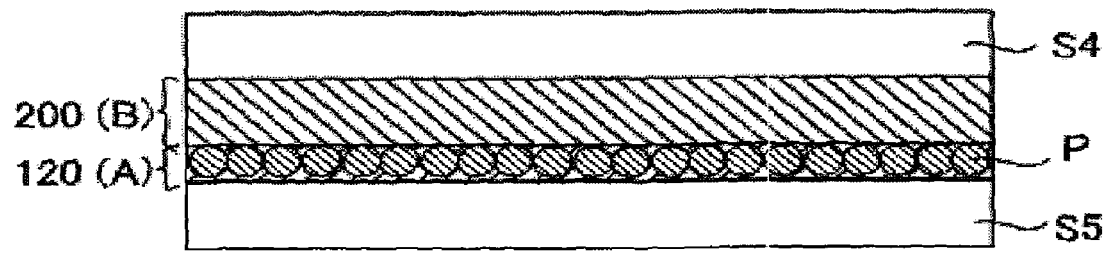
FIG. 6C is a schematic explanatory diagram showing the anisotropic conductive film of Example 2.

Thereafter, an insulating layer 200 was formed, and laminated onto the conductive particle-contained layer 120 in the same manner as in Example 1, to thereby obtain an anisotropic conductive film (see FIG. 6C).

EXAMPLE 3

An anisotropic conductive film was produced in the same manner as in Example 1, provided that the ingredients of a coating solution for the conductive particle-contained layer used in Example 1 was replaced with the ingredients shown in Table 4, and a carbon black was added to the ingredients as the curing light absorbent.

<Conductive Particle-Contained Layer (ACF Layer) Forming Step>

A coating solution for a conductive particle-contained layer was prepared based upon the ingredients shown in Table 4.

TABLE 4

| Ingredients | Proportion (part(s) by mass) |
|---|---|
| Acryl polymer (PML103, manufactured by Soken Chemical & Engineering Co., Ltd.) | 55 |
| Acryl monomer (M450, manufactured by Toagosei Co., Ltd.) | 45 |
| Photopolymerization initiator (IRGANOX ® 369, manufactured by Chiba Japan K.K.) | 1 |
| Thermoset initiator (PERHEXA 3M, manufactured by NOF Corporation) | 4 |
| Curing light absorbent (carbon black) (Asahi-Thermal, manufactured by Asahi Carbon Co., Ltd., average particle size: 80 nm) | 1 |
| Toluene | 100 |
| Total | 206 |

The thus obtained coating solution for EL conductive particle-contained layer was applied onto a releasable PET sheet S1 using a bar coater, and dried at 60° C. for 10 minutes so as to evaporate the solvent contained therein, to thereby obtain a film A having a thickness of 10 μm (see FIG. 5A). The surface of the thus obtained film A had tackiness.

Into a 0.1 L container, 50 g of Ni—Au plated conductive particles P having an average particle diameter of 4 μm (BRIGHT GNR-EHLCD, manufactured by Nippon Chemical Industrial Co., Ltd.) were placed, circulated by means of an airjector, and sprayed on the film A formed on the releasable PET sheet S1 from the air tube with the pressure of 0.5 MPa, at the ratio of 18,000 pieces/mm$^2$ on the number average. Note that, the film A was conveyed at the speed of 0.6 m/min, the air tube was fixed at the position where was 10 cm higher than the film A, and the conductive particles P were sprayed horizontally at the constant speed. As a result, the conductive particles P were aligned into a monolayer on the film A (see FIG. 5B).

A releasable PET sheet S2 which was thinner than the releasable PET sheet S1 was laminated on the surface of the conductive particles P aligned into a monolayer on the film A (see FIG. 5C).

Using a roll laminator R, the conductive particles P were pressed towards the film A from the side of the releasable PET sheet S2 so that the conductive particles P were embedded in the film A (see FIG. 5D). Thereafter, the releasable PET sheet S2 was released, and as shown in FIG. 5E, a conductive particle-contained layer 100 in which the film A had the conductive particle P which were aligned into a monolayer adjacent to one surface thereof relative to the thickness direction of the film A.

The amount of the conductive particles P aligned into a monolayer was 18,000 pieces/mm$^2$ on the number average, the amount of the conductive particles P contained in the conductive particle-contained layer 100 was 3 vol % per 10 μm-thickness on the volume average.

Figure 7A:
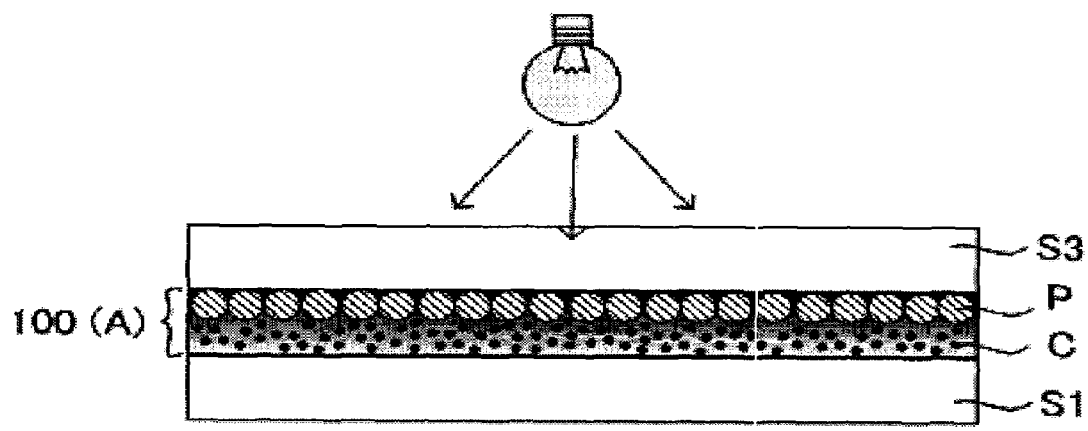
FIG. 7A is a schematic explanatory diagram showing an exposure method of ultraviolet ray in the method for producing the anisotropic conductive film of Example 3.

A transparent releasable PET sheet S3 was laminated on the side of film A at which the conductive particles P were present. Here, the transparent releasable PET sheet S1 bonded to the other side may be left as it is or may be released. As the curing light, a UV light was used and the film A was exposed to the UV light from the side of the transparent PET sheet S3 at the exposure dose of 13 mW/cm$^2$ for 1 minute by means of a high pressure mercury vapor lamp (see FIG. 7A). As a result of this, the side of the conductive particle-contained layer 100 at which the conductive particles P were present was photocured, and relative to the thickness direction thereof, the portion of the conductive particle-contained layer which was lower side from the conductive particles P (the side where the conductive particles P were not present) was not photocured as the carbon black absorbed the UV light and shielded the transmission of the UV light. One the releasable PET sheet S3 was released, though the both sides of the conductive particle-contained layer 100 had had tackiness before the exposure of the UV light, after the exposure of the UV light it was found that only the side of the conductive particle-contained layer 100 at which the conductive particles P were present lost tackiness.

Figure 7B:
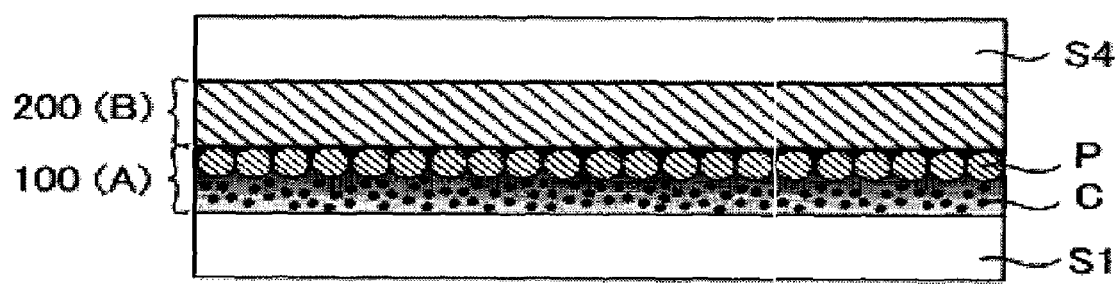
FIG. 7B is a schematic explanatory diagram showing the anisotropic conductive film of Example 3.

Thereafter, an insulating layer 200 was formed in the same manner as in Example 1, and then laminated on a surface of the conductive particle-contained layer 100 from which the transparent releasable PET sheet S3 had been released to thereby obtain an anisotropic conductive film (see FIG. 7B).

COMPARATIVE EXAMPLE 1

-Production of Anisotropic Conductive Film-

An anisotropic conductive film was produced in the same manner as in Example 1, provided that UV radiation was not performed. The conductive particle-contained layer of the thus obtained anisotropic conductive film was in the uncured state, and both surfaces of which had tackiness.

COMPARATIVE EXAMPLE 2

-Production of Anisotropic Conductive Film-

An anisotropic conductive film was produced in the same manner as Example 1, provided that the releasable PET sheet S1 disposed on the surface of the Film A opposite to the surface thereof where the conductive particles P were present was not released at the time of the UV radiation. Since the releasable PET sheet S1 was not released at the time of the UV radiation, the radical polymerization reaction was not inhibited by the oxygen present in the art, and thus the thus obtained anisotropic conductive film had the conductive particle-contained layer which was uniformly photo-cured in its thickness direction. Therefore, both surfaces of the conductive particle-contained layer did not have tackiness.

COMPARATIVE EXAMPLE 3

-Production of Anisotropic Conductive Film-

An anisotropic conductive film was produced in the same manner as in Example 1, provided that the ingredients of the coating solution for the conductive particle-contained layer used in Example 1 were replaced with the ingredients shown in Table 5, and the UV radiation was not performed on the obtained the conductive particle-contained layer. The thus obtained anisotropic conductive film was an equivalent to the conventional two-layered anisotropic conductive film, and the conductive particle-contained layer of the obtained anisotropic conductive film was such that conductive particles were dispersed in the uncured resin, and both surfaces of which had tackiness.

TABLE 5

| Ingredients | Proportion (parts by mass) |
| --- | --- |
| Epoxy resin (EP828, manufactured by Japan Epoxy Resins Co., Ltd.) | 40 |
| Phenoxy resin (PKHH, manufactured by Union Carbide Corporation) | 30 |
| Latent curing agent (HX3941HP, manufactured by Asahi Kasei Corporation) | 30 |
| Conductive particles (BRIGHT GNR-EHLCD, diameter of 4 μm, manufactured by Nippon Chemical Industrial Co., Ltd.) | 10 |
| Toluene | 100 |
| Total | 210 |

COMPARATIVE EXAMPLE 4

-Production of Anisotropic Conductive Film-

An anisotropic conductive film was produced in the same manner as in Example 3, provided that UV radiation was not performed. The conductive particle-contained layer of the thus obtained anisotropic conductive film was in the uncured state, and both surfaces of which had Tackiness.

COMPARATIVE EXAMPLE 5

-Production of Anisotropic Conductive Film-

An anisotropic conductive film was produced in the same manner as Example 3, provided that a carbon black was not added to the conductive particle-contained layer as the curing light absorbent. Since the conductive particle-contained layer of the thus obtained anisotropic conductive film did not contain the carbon black, the radical polymerization reaction was not inhibited at the time of the UV radiation, and thus the conductive particle-contained layer was uniformly photo-cured in the thickness direction thereof. Therefore, both surfaces of the conductive particle-contained layer did not have tackiness.

<Confirmation of Deviation in Degree of Cure>

Each of the thus obtained anisotropic conductive films of Examples 1 to 3 and Comparative Examples 1 to 5 was subjected to the following peeling test so as to confirm whether or not the conductive particle-contained layer had the deviation in the degree of cure in the thickness direction thereof

[Peeling Test]

An adhesive tape (T-4000, manufactured by Sony Chemical & Information Device Corporation) was applied to the surface of the conductive particle-contained layer at where the conductive particles are not present (the surface opposite to the surface where was in contact with the insulating layer), and then the adhesive tape was peeled. The surface from which the adhesive tape was peeled was observed under a microscope.

As a result, it was found that each anisotropic conductive film of Examples 1 to 3 had a peeled surface having irregularities without any clear interface, and thus confirmed the anisotropic conductive films of Examples 1 to 3 had a deviated degree of cure in the conductive particle-contained layer along the thickness direction thereof.

On the other hand, each anisotropic conductive film of Comparative Examples 1, 3 and 4 was separated and peeled at the boundary surface between the insulating layer and the conductive particle-contained layer, the peeled surface was substantially plane and there was clear interface between the layers. Therefore, it was confirmed that the anisotropic conductive films of Comparative Examples 1, 3 and 4 had a deviated degree of cure in the conductive particle-contained layer along the thickness direction thereof. Moreover, in each anisotropic conductive film of Comparative Examples 2 and 5, the adhesive tape and the conductive particle-contained layer were separated at the surface where the adhesive tape was adhered, and there was clear interface on the peeled surface. Therefore, it was confirmed that the anisotropic conductive films of Comparative Examples 2 and 5 had a deviated degree of cure in the conductive particle-contained layer along the thickness direction thereof.

<Production Example of Bonded Structure>

A bonded structure of the following ITO glass substrate and IC chip was produced using each of anisotropic conductive films produced in the same manner as in Examples 1 to 3, and Comparative Examples 1 to 5, respectively.

ITO glass substrate An indium tin oxide (ITO) electrode was formed on one surface of a glass substrate having a thickness of 0.7 mm IC chip IC chip having a size of 2 mm×20 mm×0.55 mm (thickness), and bumps each having an area of 2,500 μm$^2$ The releasable PET sheets formed on the both surfaces of each anisotropic conductive film were released, and the anisotropic conductive film was placed so that the conductive particle-contained layer 100 was in contact with the IC chip and the insulating layer 200 was in contact with the ITO glass substrate. Then the IC chip and the ITO glass substrate were brought into contact to each other via the anisotropic conductive film, and pressed and bonded at 190° C. and 60 MPa for 10 seconds.

The thus obtained bonded structures of Examples 1 to 3 and Comparative Examples of 1 to 5 were subjected to the measurements of a particle capturing rate and electrical resistance in the following manners. The results are shown in Table 6.

[Particle Capturing Ratio]

(1) Numbers of the conductive particles present in the conductive particle-contained layer before bonded to the IC chip and ITO glass substrate were observed and counted under a microscope.

(2) Then, after boning the anisotropic conductive film to the IC chip and ITO glass substrate, a number of the conductive particles present on the bumps of the IC chip were counted using a microscope. Here, only conductive particles which clearly contributed to the conduction were counted and the conductive particles which were merely present at the edge of the bump, part of which was outside the bump, or which was not sufficiently squeezed by the bump and the ITO electrode were not counted.

(3) Based on the number obtained in (1) and (2), a ratio of the number of the conductive particles per unit area of the bump before and after bonded to the IC chip and ITO glass substrate was calculated. This ratio is equivalent to the particle capturing ratio.

[Electrical Resistance]

The electrical conduction between the bumps of the IC chip and the ITO electrode of the ITO glass substrate was evaluated by measuring the electrical resistance. The measured value of the electrical resistance was evaluated based upon the following criteria:

-Evaluation Criteria-

A: 50 mΩ or less

B: more than 50 mΩ to less than 200 mΩ

C: 200 mΩ or more

TABLE 6

|  | Number of captured particles per bump (pieces) | Particle capturing ratio (%) | Electrical resistance Measured value (mΩ) | Evaluation |
|---|---|---|---|---|
| Ex. 1 | 41 | 90 | 50 | A |
| Ex. 2 | 40 | 90 | 47 | A |
| Ex. 3 | 38 | 85 | 62 | B |
| Comp. Ex. 1 | 10 | 25 | 270 | C |
| Comp. Ex. 2 | Did not bond to ITO glass substrate | | | |
| Comp. Ex. 3 | 21 | 30 | 55 | B |
| Comp. Ex. 4 | 10 | 25 | 55 | B |
| Comp. Ex. 5 | Did not bond to ITO glass substrate | | | |

From the results shown in Table 6, the anisotropic conductive films of Examples 1 to 3 had electrical resistance (i.e. conductivity) which was not inferior to that of the anisotropic conductive film of Comparative Example 3, which was an equivalent to the conventional two-layered anisotropic conductive film. Moreover, as the anisotropic conductive films of Examples 1 to 3 had higher particle capturing ratio than that of the anisotropic conductive film of Comparative Example 3, it could be assumed that the anisotropic conductive films of Examples 1 to 3 could make bumps of very small size, which would come out in the future, capture the sufficient number of the conductive particles.

The anisotropic conductive films of Comparative Examples 1 and 4 had low particle capturing ratio, as the exposure of the UV light was not performed in Comparative Examples 1 and 4, and thus the conductive particles moved when the IC chip and ITO glass substrate were pressed and bonded.

Note that, although the electrical resistance was relatively preferable in Comparative Examples 3 and 4, the particle capturing ratio was extremely low and thus it could be assumed that it would be difficult to realize the fine pitch connection of very small bumps using the anisotropic conductive films of Comparative Examples 3 and 4.

Moreover, the anisotropic conductive films of Comparative Examples 2 and 5 did not have the deviated degree of cure in the thickness direction of the conductive particle-contained layer, and the conductive particle-contained layer thereof was uniformly cured on the whole, and was not adhered to the ITO glass substrate, and thus the bonded structure could not be produced.

The anisotropic conductive film of the present invention is suitably used for connection between various electronic parts and a substrate, or a substrate and a substrate. For example, the anisotropic conductive film of the present invention can be suitably used for the production of an IC tag, IC card, memory card, flat panel display or the like.

The method for producing an anisotropic conductive film of the present invention can efficiently produce an anisotropic conductive film, and is particularly suitably used for the production of the anisotropic conductive film of the present invention.

The bonded structure of the present invention has a high capturing ratio of conductive particles and excellent conduction reliability, and can prevent the occurrence of a short circuit.

What is claimed is:

1. An anisotropic conductive film, comprising:
    an insulating layer formed of an insulating resin composition; and
    a conductive particle-contained layer comprising a photo and thermal curing resin composition and conductive particles, the conductive particles being aligned into a monolayer in a portion adjacent to an interface with the insulating layer,
    wherein the conductive particle-contained layer has a degree of cure which is gradually lowered in a thickness direction of the conductive particle-contained layer, from the side where the conductive particles are present to the side where the conductive particles are not present.

2. The anisotropic conductive film according to claim 1, wherein the conductive particle-contained layer is formed by being exposed to curing light from the side where the conductive particles are present.

3. The anisotropic conductive film according to claim 2, wherein the exposure of the curing light is performed in at least one state of where a surface of the conductive particle-contained layer at which the conductive particles are not present is made into contact with oxygen, and where the conductive particle-contained layer is added with an absorbent for the curing light.

4. The anisotropic conductive film according to claim 1, wherein the photo and thermal curing resin composition comprises a photopolymerization initiator.

5. The anisotropic conductive film according to claim 1, wherein the photo and thermal curing resin composition comprises a thermoset initiator.

6. The anisotropic conductive film according to claim 1, wherein the photo and thermal curing resin composition comprises a (meth)acryl monomer, and the insulating resin composition comprises epoxy resin.

7. The anisotropic conductive film according to claim 1, wherein the insulating layer has a thickness of 5-20 μm, the conductive particle-contained layer has a thickness of 3-20 μm, the conductive particles have an average particle size of 2-10 μm, and the anisotropic conductive film has a total thickness of 10-50 μm.

8. The anisotropic conductive film according to claim 1, wherein the conductive particle-contained layer has a thickness of 5-20 μm, and the conductive particles have an average particle size of 2-4 μm.

9. The anisotropic conductive film according to claim 1, wherein the conductive particle-contained layer has a thickness of 10-20 μm, and the conductive particles have an average particle size of 2-5 μm.

10. A method for producing an anisotropic conductive film, comprising:
    aligning conductive particles into a monolayer at one side of a layer comprising a photo and thermal curing resin composition, and exposing the one side of the layer to curing light so as to form a conductive particle-contained layer; and
    laminating an insulating layer formed of an insulating resin composition on the one side of the conductive particle-contained layer,
    wherein the conductive particle-contained layer has a degree of cure which is gradually lowered in a thickness direction of the conductive particle-contained layer, from the side where the conductive particles are present to the side where the conductive particles are not present.

11. The method according to claim 10, wherein the insulating layer has a thickness of 5-20 μm, the conductive particle-contained layer has a thickness of 3-20 μm, the conductive particles have an average particle size of 2-10 µm, and the anisotropic conductive film has a total thickness of 10-50 µm.

12. The method according to claim 10, wherein the conductive particle-contained layer has a thickness of 5-20 µm, and the conductive particles have an average particle size of 2-4 µm.

13. The method according to claim 10, wherein the conductive particle-contained layer has a thickness of 10-20 µm, and the conductive particles have an average particle size of 2-5 µm.

14. A method for producing an anisotropic conductive film, comprising:

aligning conductive particles into a monolayer at one side of a layer comprising a photo and thermal curing resin composition, and exposing the one side of the layer to curing light so as to form a conductive particle-contained layer; and laminating an insulating layer formed of an insulating resin composition on the one side of the conductive particle-contained layer, wherein the exposure of the curing light is performed in a state of where a surface of the layer at which the conductive particles are not present is made into contact with oxygen.

15. The method according to claim 14, wherein the insulating layer has a thickness of 5-20 µm, the conductive particle-contained layer has a thickness of 3-20 µm, the conductive particles have an average particle size of 2-10 µm, and the anisotropic conductive film has a total thickness of 10-50 µm.

16. A bonded structure, comprising:

at least two of electronic parts and substrates; and an anisotropic conductive film, wherein the at least two of electronic parts and substrates are electrically connected via the anisotropic conductive film, and the anisotropic conductive film comprises:

an insulating layer formed of an insulating resin composition; and a conductive particle-contained layer comprising a photo and thermal curing resin composition and conductive particles, the conductive particles being aligned into a monolayer in a portion adjacent to an interface with the insulating layer, wherein the conductive particle-contained layer has a degree of cure which is gradually lowered in a thickness direction of the conductive particle-contained layer, from the side where the conductive particles are present to the side where the conductive particles are not present.

17. The bonded structure according to claim 16, wherein a particle capturing ratio of the conductive particles is 80% or more at a connecting portion of the at least two of electronic parts and substrates.

18. The bonded structure according to claim 16, wherein the insulating layer has a thickness of 5-20µm, the conductive particle-contained layer has a thickness of 3-20 µm, the conductive particles have an average particle size of 2-10 µm, and the anisotropic conductive film has a total thickness of 10-50 µm.

19. The bonded structure according to claim 16, wherein the conductive particle-contained layer has a thickness of 5-20 µm, and the conductive particles have an average particle size of 2-4 µm.

20. The bonded structure according to claim 16, wherein the conductive particle-contained layer has a thickness of 10-20 µm, and the conductive particles have an average particle size of 2-5 µm.

\* \* \* \* \*

UNITED STATES PATENT AND TRADEMARK OFFICE
CERTIFICATE OF CORRECTION

PATENT NO.        : 7,931,956 B2
APPLICATION NO.   : 12/473355
DATED             : April 26, 2011
INVENTOR(S)       : Yasuhiro Fujita It is certified that error appears in the above-identified patent and that said Letters Patent is hereby corrected as shown below:

On the title page, Item 73, the Assignees information is incorrect. Item 73 should read as follows:

--(73) Assignees: Sony Corporation, Tokyo, (JP);
    Sony Chemical & Information Device Corporation, Tokyo, (JP)--

Signed and Sealed this
Twenty-seventh Day of September, 2011

David J. Kappos
*Director of the United States Patent and Trademark Office*